United States Patent
Chen et al.

(10) Patent No.: US 6,589,384 B2
(45) Date of Patent: Jul. 8, 2003

(54) SOLVENTLESS LAMINATING ADHESIVE WITH BARRIER PROPERTIES

(75) Inventors: Mai Chen, Hoffman Estates, IL (US); Jeffrey Harold Deitch, Crystal Lake, IL (US)

(73) Assignee: Rohm and Haas Company, Philadelphia, PA (US)

( * ) Notice: Subject to any disclaimer, the term of this patent is extended or adjusted under 35 U.S.C. 154(b) by 147 days.

(21) Appl. No.: 09/808,704

(22) Filed: Mar. 15, 2001

(65) Prior Publication Data

US 2001/0013393 A1 Aug. 16, 2001

Related U.S. Application Data

(63) Continuation-in-part of application No. 08/932,126, filed on Sep. 17, 1997, now abandoned.

(51) Int. Cl.$^7$ .............................................. C09J 175/06
(52) U.S. Cl. ................... 156/331.7; 428/423.1
(58) Field of Search ................ 156/331.7, 80, 156/325, 331.1; 428/423.5, 424.8, 423.1; 528/65, 85

(56) References Cited

U.S. PATENT DOCUMENTS

| 2,801,648 | A | * | 8/1957 | Anderson et al. ........... 138/170 |
| 3,874,989 | A | | 4/1975 | Stange et al. |
| 4,010,311 | A | * | 3/1977 | Lewis et al. ................. 428/412 |
| 4,242,488 | A | * | 12/1980 | Stanley et al. ........... 156/331.7 |
| 4,797,463 | A | | 1/1989 | Grimm et al. |
| 5,872,203 | A | * | 2/1999 | Wen et al. ..................... 528/85 |
| 6,462,163 | B2 | * | 10/2002 | Chen et al. ................... 528/83 |

FOREIGN PATENT DOCUMENTS

| DE | 160881 | * | 6/1984 | ................. 528/85 |
| EP | 488 617 | | 3/1992 | |
| FR | 1374574 | | 8/1964 | |

OTHER PUBLICATIONS

"Recent Advances in Polymers for Barrier Applications", Trends in Polymer Science, Mar. 1997, vol. 5, No. 3, pp. 75–79.

* cited by examiner

*Primary Examiner*—Michael W. Ball
*Assistant Examiner*—Gladys Corcoran
(74) *Attorney, Agent, or Firm*—Stephen T. Falk

(57) ABSTRACT

A solventless urethane adhesive layer which proves excellent oxygen and moisture barrier properties is formed from the reaction of A) a low molecular weight polyester formed from a single species of linear aliphatic diol and a single species of dicarboxylic acid with B) a single species of diisocyanate.

9 Claims, No Drawings

SOLVENTLESS LAMINATING ADHESIVE WITH BARRIER PROPERTIES

This application is a continuation-in-part of U.S. application Ser. No. 08/932,126, filed on Sep. 17, 1997, now abandoned.

The present invention is directed to laminating adhesives useful for joining polymeric films, particularly in providing polymeric film laminates for food products, drug products, and the like. The laminating adhesive is "solventless", meaning it is both water-free and organic solvent-free. The adhesive provides excellent oxygen and moisture barrier properties.

BACKGROUND OF INVENTION

Oxygen, moisture, and other gases tend to degrade many food and drug products. Many polymeric films useful in food packaging, drug packaging, or the like are relatively permeable to both oxygen and moisture. To enhance barrier properties, polymeric films may be bonded together to form laminates using adhesive layers having high barrier properties.

Currently, barrier laminating adhesives are chiefly waterborne or solvent-borne polyvinylidine chloride (PVDC) formulations. If the solution is water-borne, energy needs to be expended to evaporate the water. Organic solvent-based formulations also involve some energy expenditure in removing the solvent, and solvents represent a workplace and environmental detriment. Packagers who have only solventless laminating machines must use films that are pre-coated with PVDC. Also, the chlorine in PVDC represents an environmental contaminant.

Another high barrier material is ethylene vinyl alcohol, (EVOH), typically applied as a water-based adhesive formulation. While EVOH has no chlorine, the water in the formulation represents an energy expenditure. EVOH has a high melting temperature, i.e., greater than 150° C. At such high melting temperature, most polymeric films would also melt; thus EVOH cannot be applied as a solventless adhesive. While EVOH has excellent barrier properties with respect to oxygen and other gases, it has poor moisture barrier properties. Also, EVOH is relatively expensive.

The present invention is directed to solventless urethane adhesives useful for laminating and which provide high barrier properties, both with respect to oxygen and with respect to moisture. Most commercial urethane solventless adhesives have very poor oxygen barrier properties because such urethane adhesives tend to be amorphous polymers.

SUMMARY OF INVENTION

Solventless urethane adhesives in accordance with the invention comprise the reaction product of A) a hydroxyl terminated polyester formed from a single linear aliphatic diol having between 2 and 10 carbon atoms, preferably between 3 and 6 carbon atoms, and a single linear dicarboxylic acid with B) a single species of liquid diisocyanate at an NCO/OH ratio of between about 1 and about 1.1. The polyester A) is in crystalline form at ambient temperature and has a melting point of about 80° C. or below, preferably about 70° C. or below, more preferably about 60° C. or below, and most preferably about 55° C. or below. The number average ($M_n$) molecular weight of the polyester is between about 300 and about 5000, preferably between about 500 and about 2000. Because the resulting urethanes are formed from a single linear diol, a single linear dicarboxylic acid and a single diisocyanate species, the polyurethanes have high crystallinity with attendant high oxygen and high moisture barrier properties. The low melting points of the polyesters allows the adhesives to be applied at low temperatures without any solvent, whereby the polymer films being laminated are not degraded and not deformed.

It is within the scope of the invention, and is in some cases preferred, that a portion A') of the polyester A) be reacted with all of or a portion B') of the isocyanate B) at an NCO/OH ratio of between about 2 and about 8 to form a urethane prepolymer C), and the remaining portion A") of the polyester A) subsequently admixed with the prepolymer C) and any remaining portion B") of the isocyanate B) to form an adhesive mixture suitable for laminating the adhesives. In such case, the NCO/OH ratio of B), including in such case B') and B"), to A), including both A') and A"), is, nevertheless, between about 1 and about 1.1.

DETAILED DESCRIPTION OF INVENTION

Preferred linear aliphatic diols for forming the polyester chains are $C_3$–$C_6$ diols, n-butanediol and n-hexanediol being; the preferred diols, both from the standpoint of forming an adhesive with good barrier properties and from an availability and economic standpoint.

Adipic acid is the preferred dicarboxylic acid for forming the polyesters of the present invention, although other suitable dicarboxylic acids may be used, including, but not limited to azelaic acid and sebacic acid.

Currently, the most preferred polyesters are the reaction products of either 1,6-hexanediol or 1,4-butanediol with adipic acid.

Diol is reacted with dicarboxylic acid so as to form hydroxyl-terminated polyesters having OH numbers between about 20 and about 350, preferably between about 100 and about 250.

Preferred diisocyanates are aliphatic diisocyanates, particularly linear diisocyanates, including polymeric hexamethylene diisocyanate (HDI).

However, other diisocyanates, including methylene diphenyl diisocyanate (MDI), dicyclohexylmethane 4,4'-diisocyanate ($H_{12}$MDI) and toluene diisocyanate (TDI) may also be used. The diisocyanate generally comprise a smaller portion of the linear polyurethane chain than does the polyester; thus the choice of diisocyanate is generally less critical than the nature of the polyester. From the standpoint of forming a very high barrier, polymeric HDI is currently preferred. However, polymeric HDI is a relatively expensive material, and less expensive diisocyanates, such as MDI, may be used where the barrier property demands are less stringent.

The diisocyanates useful in the invention are liquids at ambient temperatures, i.e., 20–25° C. The low molecular weight polyesters of the invention are highly crystalline, but melt at relatively low temperatures due to their low molecular weights. It is necessary that the polyesters melt at a low temperature only somewhat above ambient temperatures so that the adhesives may be applied at a temperature only somewhat above ambient temperatures, whereat the polymer films forming the laminate are not degraded or deformed. This, of course, depends upon the particular nature of the polymeric film(s), but generally it is desired that the polyester melt below about 80° C. and even lower for the more heat-sensitive films.

For application using high speed laminating machines, e.g., 600 ft/min (183 m/min) or higher, it is preferred that the viscosity of the diisocyanate/polyester mixture range from about 300 to about 2000 cps at the laminating temperature, preferably between about 400 to about 1000 cps at the laminating temperature. Preferably the laminating temperature is 80° C. or below, more preferably 70° C. or below, even more preferably 60° C. or below, and most preferably 55° C. or below. Accordingly, for reference purposes, depending upon the particular application, the above-described viscosities should apply at least one of the above-listed temperatures, i.e., 80°, 70°, 60°, or 55° C.

In one embodiment of the invention, the films are processed at low temperature. For example, in a process using high speed laminating machines (e.g., speeds of 600 ft/min or higher) with a preferred viscosity of the adhesive mixture in the range from about 300 to about 2000 cps at the application temperature, and a preferred lamination application roll temperature of 80° C. or below (more preferably 70° C. or below, even more preferably 55° C. or below), the nip roll temperature is preferably lower than the application temperature. In this embodiment, the nip roll temperature is preferably 55° C. or below, more preferably 15° C. or below, still more preferably 5° C. or below. Preferably, the chill roll temperature is 40° C. or below, more preferably 20° C. or below, still more preferably 5° C. or below. Other extra chill equipment may also be used to help the crystallization of the adhesive before it fully cures.

The adhesives of the present invention are useful for adhering a wide variety of polymer film types, including polypropylenes, polyethylenes, polyesters, polyamide, and coextruded films. Of course, the adhesives are most useful in adhering films having poor barrier properties to provide high barrier laminates. Adhesion between two films is very good, and laminates formed from the urethane adhesives are inseparable Generally, the two adhesive components are mixed just prior to lamination, i.e., within about 1 minute of lamination or less, molten polyester being mixed with liquid diisocyanate to form an adhesive mixture composition. The adhesive mixture composition is applied to one of the polymer films and the films nipped together and the resulting laminate rolled into a reel. Coating weights typically range from 1 to 3 pounds per ream (1.6–4.9 g/m$^2$), preferably around 1.5 pounds per ream (2.4 g/m$^2$). A slow urethane-forming reaction, wherein crystalline polyester domains are formed prior to substantial cure of the adhesive mixture, is most desirable for achieving high barrier properties, and after lamination, the laminate is rolled and the reel stored at ambient temperature for a period sufficient to effect complete reaction between the isocyanate and the hydroxyl groups of the polyester; typically, at least a week storage at ambient temperature is desired. As noted above, in one embodiment of the invention, the process utilizes a low temperature nip and a chill roll. Cooling of the film and adhesive is believed to contribute to development of the crystalline polymer domains prior to substantial curing of the adhesive.

It is further within the scope of the present invention to pre-react the diisocyanate with a portion of the polyester so as to form low viscosity isocyanate-capped prepolymers and reacting the remainder of the polyester with the prepolymer, and an NCO/OH ratio of between about 1 and about 1.1 at point at application. In either case, single species of diol, dicarboxylic acid and, preferably, diisocyanate are used to provide an adhesive layer of high crystallinity and, therefore, high barrier properties with respect to oxygen, moisture and other gases. If a prepolymer is formed, an NCO/OH ratio of between about 2 to about 8 is generally used in forming the prepolymer. The main reason for forming a prepolymer in which a portion of the polyester is pre-reacted with the diisocyanate is to ensure that the viscosity of the adhesive mixture composition is not too low at the application temperature. Generally, if this method is followed, all of the diisocyanate will be reacted with an appropriate portion of the polyester. However, if even 25 wt % of the diisocyanate is pre-reacted with an appropriate portion of the polyester, a significant adjustment in viscosity may be seen. Preferably, at least 50 wt % of the polyester is pre-reacted, if urethane prepolymer is desired for viscosity adjustment.

An NCO/OH ratio of 1 is theoretically desired in reacting the polyester with the isocyanate, whether the polyester is reacted with a diisocyanate or whether a urethane prepolymer is reacted with a polyester. However, as the polyester may contain some residual water from the polyester condensation reaction, a slight excess of diisocyanate is typically used, up to an NCO/OH ratio of about 1.1.

The invention will now be described in greater detail by way of specific examples.

EXAMPLES 1–6

Example 1

13 parts by weight (pbw) of a polyester of 1,4, butanediol adipate (OH#225) is admixed with 10 parts by weight of polymeric HDI. The mixture is coated onto a 1 mil (25 micron), clear oriented polypropylene (OPP) film at 1.6 pounds per ream (2.6 g/m$^2$) coating weight. Another 1 mil OPP film was laminated to the coated film at a nip temperature of 160° F. (71° C.).

Example 2

26.4 pbw of 1,6-hexanediol adipate (OH#112) was mixed with 10 pbw HDI polyisocyanate. The adhesive was coated onto a 1 mil low density polyethylene (LDPE) film at 2 lb/rm coating weight. Another 1 mil LDPE film was coated onto the coated film at a nip temperature of 160° F. (71° C.).

Example 3

40 pbw of 1,6-liexanediol adipate (OH#112) was mixed with 10 pbw of 2,4'–4,4-methylene diphenyl diisocyanate (MDI). The mixture was used to laminate two 1 mil coextruded (COEX) films at a nip temperature of 160° F.

Comparative Example 4

40 pbw of diethyleneglycol adipate (OH#112) was mixed with 10 pbw 2,4'–4,4'-MDI and used to form a laminate as per example 3.

Comparative Example 5

A conventional amorphous urethane adhesive was used to laminate two 1 mil LDPE adhesives as per example 2.

For reference, 1 mil layer of the films used in the examples without the adhesive layer have oxygen transmission rates (OTRs) in cc/in$^2$/day at 0% humidity, 75° F.: LDPE—479.0; OPP—98.0; and COEX—85.6.

Results are as follows (OTR in cc/in$^2$/day at 0% humidity 75° F.)

| Example 1 | Example 2 | Example 3 | Comp. Ex. 4 | Comp. Ex. 5 |
| --- | --- | --- | --- | --- |
| OPP/OPP | LDPE/LDPE | COEX/COEX | COEX/COEX | LDPE/LDPE |
| 2.3 | 5.3 | 4.0 | 42.2 | 144.5 |

The moisture vapor transmission rate of example 1 was 0.13 cc/100 in$^2$/day compared with a 1 mil layer of OPP with a moisture vapor transmission of 0.40 cc/100 in$^2$/day.

Example 6

15 pbw of 1,4-butanediol adipate ($M_n$ 700) was mixed with 10 pbw of polymeric HDI (22% NCO). The mixture was used to laminate two 1 mil OPP film at 1.2 lbs/ream coating weight at 55° C. application temperature and 55° C. nip temperature. Two of the rolls were made. One roll was chilled at 10° C. and another was chilled at 25° C. The OTR of the first roll was 0.7 cc/100 in$^2$/day at 100% relative humidity ("RH") and the OTR of the second roll was 2.9 cc/100 in$^2$/day at 100% RH.

What is claimed is:

1. A method of laminating a first film of polymeric material to a second film of polymeric material comprising:
   (a) providing, in molten form, a solventless, hydroxyl-terminated polyester A) formed from a single species of a linear aliphatic diol having terminal hydroxyl groups and having from 2 to 10 carbons and a single species of a linear dicarboxylic acid, said polyester having a number average molecular weight from about 300 to about 5000 and a melting point of 80° C. or below,
   (b) providing, in liquid form, a single species of diisocyanate B), either
   (c) mixing said diisocyanate B) and said polyester A) at an NCO/OH ratio of between about 1 and 1.1 to form an adhesive mixture (I), or
   reacting all of or a portion B') of said diisocyanate B) with a portion A') of said polyester A) at an NCO/OH ratio of between about 2 and 8 to form a urethane prepolymer C) and mixing the remaining portion A") of said polyester A) and any remaining portion B") of said diisocyanate B) with said urethane prepolymer C) to form an adhesive mixture (II), the NCO/OH ratio of A) to B) being between about 1 and 1.1,
   (d) applying either of the adhesive mixture (I) or (II) to one of said first or second films, said adhesive mixture being prepared just prior to application to said film,
   (e) contacting and adhering said films such that crystalline polyester domains are formed prior to substantial cure of said mixture and attendant polyurethane adhesive formation, and
   (f) allowing said diisocyanate B) and said polyester A) to fully react, thereby forming an adhesive layer having high gas barrier properties.

2. The method according to claim 1 wherein said diol has between 3 and 6 carbons.

3. The method according to claim 1 wherein said polyester has a number average molecular weight between about 500 and about 2000.

4. The method according to claim 1 wherein said polyester has a melting point of about 70° C. or below.

5. The method according to claim 1 wherein said polyester has a melting point of about 60° C. or below.

6. The method according to claim 1 wherein said polyester has a melting point of about 50° C. or below.

7. The method according to claim 1 wherein said adhesive is applied at a temperature whereat its viscosity ranges from about 300 to about 2000 cps.

8. The method according to claim 1 wherein said adhesive is applied at a temperature whereat its viscosity ranges from about 400 to about 1000 cps.

9. The laminate produced according to the method of claim 1.

* * * * *

UNITED STATES PATENT AND TRADEMARK OFFICE
CERTIFICATE OF CORRECTION

PATENT NO. : 6,589,384 B2
DATED : July 8, 2003
INVENTOR(S) : Mai Chen and Jeffrey Harold Deitch It is certified that error appears in the above-identified patent and that said Letters Patent is hereby corrected as shown below:

<u>Column 4,</u>
Lines 63 and 66, in the formula "$cc/in^2/day$" should be -- $cc/100\ in^2/day$ --

Signed and Sealed this

Fourteenth Day of October, 2003

JAMES E. ROGAN
*Director of the United States Patent and Trademark Office*